(12) United States Patent
Rho (10) Patent No.: US 8,811,059 B2
(45) Date of Patent: Aug. 19, 2014

(54) RESISTIVE MEMORY APPARATUS, LAYOUT STRUCTURE, AND SENSING CIRCUIT THEREOF

(75) Inventor: Kwang Myoung Rho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 315 days.

(21) Appl. No.: 13/339,159

(22) Filed: Dec. 28, 2011

(65) Prior Publication Data

US 2013/0094277 A1    Apr. 18, 2013

(30) Foreign Application Priority Data

Oct. 13, 2011  (KR) .......................... 10-2011-0104512

(51) Int. Cl.
 *G11C 11/00*   (2006.01)

(52) U.S. Cl.
 USPC ... 365/148; 365/104; 365/230.03; 365/210.1; 365/210.15

(58) Field of Classification Search
 USPC ............. 365/148, 204, 230.03, 210.1, 210.15
 See application file for complete search history.

(56) References Cited

U.S. PATENT DOCUMENTS

| 5,729,501 | A  | * | 3/1998  | Phillips et al. ............ 365/230.03 |
| 6,055,200 | A  | * | 4/2000  | Choi et al. .................... 365/201 |
| 6,795,336 | B2 |   | 9/2004  | Kim et al. |
| 6,961,261 | B2 | * | 11/2005 | Iwata ............................. 365/158 |

FOREIGN PATENT DOCUMENTS

| KR | 100300549 B1 | 6/2001 |
| KR | 1020020094355 A | 12/2002 |
| KR | 1020090010599 A | 1/2009 |
| KR | 1020110035744 A | 4/2011 |
| WO | 2004017326 A2 | 2/2004 |

* cited by examiner

*Primary Examiner* — Son Dinh
(74) *Attorney, Agent, or Firm* — William Park & Associates Patent Ltd.

(57) ABSTRACT

Provided is a resistive memory apparatus including a plurality of memory areas each including a main memory cell array coupled to a plurality of word lines and a reference cell array coupled to a plurality of reference word lines. Each of the memory areas shares a bit line driver/sinker with an adjacent memory area.

11 Claims, 6 Drawing Sheets

RESISTIVE MEMORY APPARATUS, LAYOUT STRUCTURE, AND SENSING CIRCUIT THEREOF

CROSS-REFERENCES TO RELATED APPLICATION

The present application claims priority under 35 U.S.C. §119(a) to Korean application number 10-2011-0104512, filed on Oct. 13, 2011, in the Korean Intellectual Property Office, which is incorporated herein by reference in its entirety.

BACKGROUND

1. Technical Field

The present invention relates generally to a semiconductor memory apparatus, and more particularly to a resistive memory apparatus, a layout structure, and a sensing circuit thereof.

2. Related Art

Data stored in a resistive memory apparatus can be read by sensing a current flowing through a memory cell of the resistive memory apparatus during a read operation. The resistive memory apparatus may include a phase change random access memory (PCRAM), a magnetic random access memory (MRAM), a resistive random access memory (ReRAM) and so on. The operation principles of the respective memory apparatuses differ from each other. Nevertheless, a read operation may be understood to be performed in the same manner.

Figure 1:
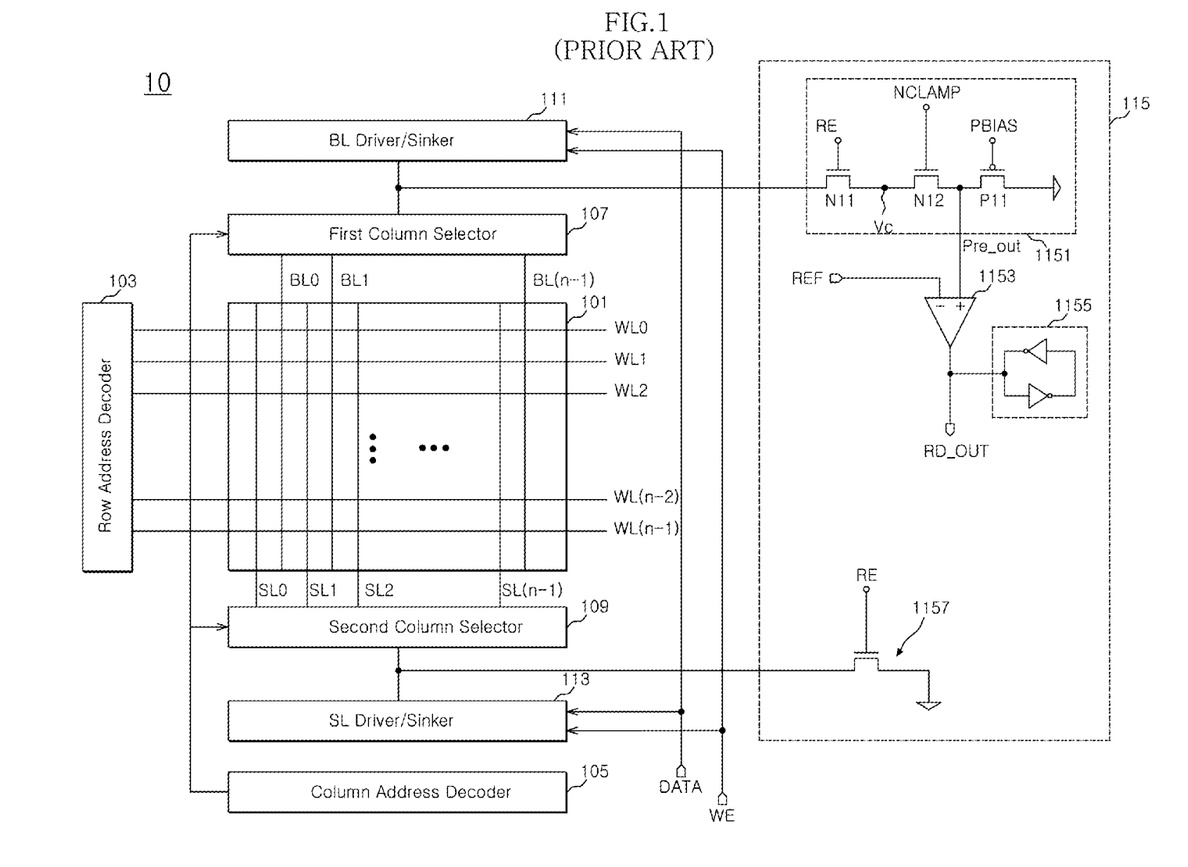
FIG. 1 illustrates a known resistive memory apparatus.

FIG. 1 illustrates a known resistive memory apparatus.

Referring to FIG. 1, the resistive memory apparatus 10 includes a memory cell array 101, a row address decoder 103, a column address decoder 105, a first column selector 107, a second column selector 109, a bit line driver/sinker 111, a source line driver/sinker 113, and a sensing circuit 115. The memory cell array 101 includes a plurality of memory cells coupled between a plurality of bit lines/source lines BL/SL, and a plurality of word lines WL. The row address decoder 103 is configured to drive a word line in response to an external address. The column address decoder 105 is configured to drive the first and second column selectors 107 and 109 in response to an external address. The first column selector 107 is configured to drive a bit line. The second column selector 109 is configured to drive a source line. The bit line driver/sinker 111 is configured to apply a predetermined voltage to the bit line driven by the first column selector 107. The source line driver/sinker 113 is configured to apply a predetermined voltage to the source line driven by the second column selector 109.

When a specific memory cell is enabled by the word line driven by the row address decoder 103, a resistor between a source line and a bit line has a high-level or low-level depending on a resistance state of the memory cell.

During a write operation, that is, when a write enable signal WE is enabled to a high level and a read enable signal RE is disabled to a low level, write circuits such as the bit line driver sinker 111 and the source line driver/sinker 113 operate to drive the selected bit line and source line according to data DATA provided from outside. The resistance of a memory cell selected according to the operation changes to a high or low level.

During a read operation, that is, when the write enable signal WE is enabled to a low level and the read enable signal RE is disabled to a high level, the write circuits such as the bit line driver/sinker 111 and the source line driver/sinker 113 are deactivated, and the sensing circuit 115 is activated. Then, the source line is coupled to a ground terminal, and the bit line is coupled to a sensing node Vc of a sensing unit 1151 included in the sensing circuit 115.

The sensing circuit 115, by using a clamp voltage VCLAMP, does not allow an excessive voltage to be applied to the bit line during a sensing operation. Specifically, a voltage obtained by subtracting a threshold voltage of a switching element N12 from the clamp voltage VCLAMP is applied to the sensing node Vc.

When a memory cell is selected and the sensing circuit 115 is activated during the read operation, the source line becomes coupled to a ground terminal through a switching element 1157 of the sensing circuit 115. Accordingly, a current path (Vc-first column selector-BL-cell-SL-second column selector-ground terminal) is formed between the sensing node Vc and the ground terminal, and current passing through the current path varies depending on the cell resistance.

For example, when the cell resistance is low, a relatively high current IH passes and when the cell resistance is high, a relatively low current IL passes. This current also flows out from a pre-output terminal Pre_out. If it is assumed that bias voltage PBIAS is adjusted so that a current flowing into the pre-output terminal Pre_out has a value between the low current IL and the high current IH during the sensing operation, when the cell resistance value is low, the current flowing out from the pre-output terminal Pre_out becomes larger than the current flowing into the pre-output terminal Pre_out such that the voltage of the pre-output terminal Pre_out decreases. On the other hand, when the cell resistance value is high, the current from the pre-output terminal Pre_out becomes smaller than the current flowing into the pre-output terminal Pre_out such that the voltage of the pre-output terminal Pre_out increases.

Therefore, after a certain time, the cell resistance value can be determined by using a differential amplifier 1153 comparing the voltage of the pre-output terminal Pre_out with a reference voltage REF. That is, when the cell resistance value is low the voltage of the pre-output terminal Pre_out becomes smaller than the reference voltage REF such that output data RD_out becomes low, and when the cell resistance value is high, the voltage of the pre-output terminal Pre_out becomes larger than the reference voltage REF such that the output data RD_out becomes high. The sensed output data RD_out is stored in a latch 1155 and outputted to the outside at a desired time point.

In the sensing circuit 115 illustrated in FIG. 1, in the case of a resistive memory having a small difference in cell resistance value, a sensing margin may become insufficient. In order to secure a sensing margin, the bias voltage PBAIS should be controlled to supply a reference current between two cell currents IL and IH to the pre-output terminal Pre_out. In this case, since a current difference is small and the cell currents are variable, it is difficult to normally perform such a function using the bias voltage PBIAS.

Therefore, the reference current may be generated from a reference cell within a memory cell array and provided to the pre-output terminal Pre_out. This will be described with reference to FIG. 2.

Figure 2:
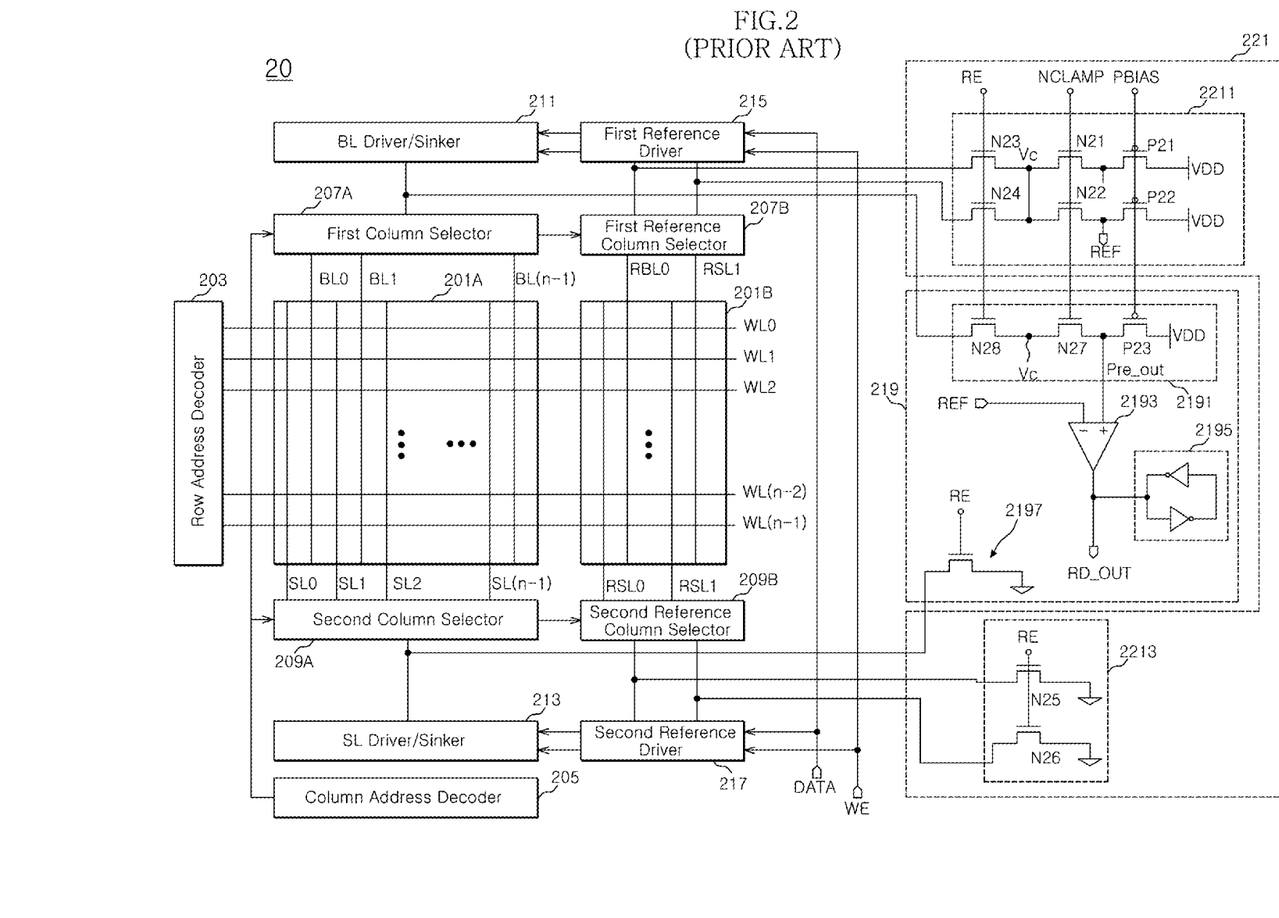
FIG. 2 illustrates another known resistive memory apparatus.

FIG. 2 illustrates another known resistive memory apparatus.

Referring to FIG. 2, the resistive memory apparatus 20 includes a main memory cell array 201A, a reference cell array 201B, a row address decoder 203, a column address decoder 205, a first column selector 207A, a first reference column selector 207B, a second column selector 209A, a second reference column selector 209B, a bit line driver/ sinker 211, a source line driver/sinker 213, a first reference driver 215, a second reference driver 217, a reference generation circuit 221, and a sensing circuit 219. The main memory cell array 201A and the reference cell array 201B include a plurality of memory cells coupled between a plurality of bit lines/source lines BL/SL and a plurality of word lines WL. The row address decoder 203 is configured to drive a word line in response to an external address. The column address decoder 205 is configured to drive the first column selector 207A, the first reference column selector 207B, the second column selector 209A, and the second reference column selector 209B in response to an external address. The first column selector 207A is configured to drive a bit line. The first reference qtr column selector 207B is configured to drive a reference bit line. The second column selector 209A is configured to drive a source line. The second reference column selector 209B is configured to drive a reference source line. The bit line driver/sinker 211 is configured to apply a predetermined voltage to the bit line driven by the first column selector 207A. The source line driver/sinker 213 is configured to apply a predetermined voltage to the source line driven by the second column selector 209A. The first reference driver 215 is configured to apply a predetermined voltage to the reference bit line. The second reference driver 217 is configured to apply predetermined voltage to the reference source line.

The resistance memory apparatus 20 of FIG. 2 includes two additional reference cell columns, unlike the resistive memory apparatus 10 of FIG. 1. In this case, high-level data are stored in n reference cells coupled to a reference column RBL0/RSL0, and low-level data are stored in n reference cells coupled to the other reference column RBL1/RSL1.

Before a read operation is started, a write operation for a reference cell is performed. The write operation is performed by the first and second reference drivers 215 and 217 coupled to the reference columns, according to the same manner as a write operation for the main memory cell array 201A.

During the read operation, that is, when a write enable signal WE is enabled to a low level and a read enabled signal RE is disabled to a high level, the operation of the sensing circuit 219 is performed in a similar manner to FIG. 1. In FIG. 2, however, two reference cells are coupled to the reference voltage generation circuit 221 during the read operation, and the reference voltage generation circuit 221 supplies a bias voltage PBIAS for generating a sensing current of the sensing circuit 219 to a sensing unit 2191, and supplies a reference voltage to a comparison unit 2193.

Reference numeral 2197 represents a switching element configured to couple a source line of a selected cell to a ground terminal, and reference numeral 2195 represents a latch configured to store an output signal of the comparison unit 2193.

More specifically, when a word line is activated and the first and second reference column selectors 207B and 209B are activated during the read operation, the reference source lines of two reference cells, that is, cells storing high data and low data are coupled to a ground terminal by a sink unit 2213, and the reference bit lines are coupled to a sensing node Vc through switching elements 123 and N24 of a reference voltage generation unit 2211. At the sensing node Vc, the two reference bit lines are coupled to each other. The voltage of the sensing node Vc corresponds to a voltage obtained by subtracting a threshold voltage of a switching element N21 or N22 from a clamp voltage VCLAMP. Here, a current path is formed through the two reference cells between the sensing node Vc and the ground terminal. Therefore, a high current IH passes through the switching element N23 and a low current IL passes through the switching element N24. These currents are currents flowing from the sensing node Vc, and are equalized to currents flowing from the switching element N21 and the switching element N22 in a normal state. That is, the following relation is established: IN21+IN22=IN23+IN24=IH+IL. However, since the clamp voltage VCLAMP is commonly applied to the gates of the switching elements N21 and N22 and the sensing node Vc is commonly coupled to the sources of the switching elements N21 and N22, the two currents IN21 and IN22 are equalized to each other when the switching elements N21 and N22 operate in a saturation region. That is, the following relation is established: IN21 IN22=($\frac{1}{2}$)*(IH+IL). Furthermore, the current of the switching element N21 is equal to a current of a switching element 121 in a normal state, and is copied into currents of switching elements 122 and P23 by current mirroring of the switching elements P21-P22 and the switching elements P21-P23. That is, the following relation is established: IP21=IP22=IP23=($\frac{1}{2}$)*(IH+IL). The reference voltage generation circuit 221 generates the reference current corresponding to an intermediate value between the two reference cell currents, that is, ($\frac{1}{2}$)*(IH+IL), and supplies the reference current to a pre-output terminal Pre_out through the switching element P23 of the sensing circuit 219.

As such, the reference voltage generation circuit 221 stably supplies the reference current between the two reference cell currents, that is, the intermediate current capable of maximizing a sensing margin to the sensing circuit 219, thereby maximizing the sensing margin of the resistive memory having a small cell resistance ratio.

The reference voltage generation circuit 221 also supplies a reference voltage REF. As described above, the current IN22 of the switching element N22 corresponds to ($\frac{1}{2}$)*(IH+IL), and the current IP22 of the switching element P22 corresponds to ($\frac{1}{2}$)*(IH+IL). Therefore, as the reference voltage REF in a normal state has a value of ($\frac{1}{2}$)*VDD, it is possible to acquire a stable reference voltage REF.

The resistive memory apparatus 20 of FIG. 2 may secure a sufficient sensing margin. However, separate circuits for writing data into reference cells, that is, the first and second reference column selectors 207B and 209B and the first and second reference drivers 215 and 217 are required. Accordingly, a separate reference cell write operation should be defined. This is because the reference cells are formed by adding the separate columns.

SUMMARY

In one embodiment of the present invention, there is provided a resistive memory apparatus including a plurality of memory areas each including a main memory cell array coupled to a plurality of word lines and a reference cell array coupled to a plurality of reference word lines. Each of the memory areas shares a bit line driver/sinker with an adjacent memory area.

In another embodiment of the present invention, a resistive memory apparatus includes: a first memory area including a first memory cell array coupled between a plurality of first source lines/bit lines and a plurality of first word lines and a first reference cell array coupled between the plurality of first source lines/bit lines and a plurality of first reference word lines; a second memory area including a second memory cell array coupled between a plurality of second source lines/bit lines and a plurality of second word lines and a second reference cell array coupled between the plurality of second source lines/bit lines and a plurality of second reference word lines; a row address decoder configured to drive a word line or reference word line in response to an external address; a column address decoder configured to drive a bit line and a source line in response to an external address; and a bit line driver/sinker commonly coupled to the first and second memory areas and configured to apply designated potential to the bit line driven by the column address decoder.

In another embodiment of the present invention, there is provided a sensing circuit for a resistive memory apparatus which includes a plurality of memory areas each including a main memory cell array and a reference cell array coupled to a plurality of reference word lines and a bit line driver/sinker shared by adjacent memory areas. The sensing circuit includes: a first sink unit configured to couple a source line coupled to a reference cell of an adjacent memory area sharing the bit line driver/sinker with a selected word line to a ground terminal, in response to a read enable signal; a second sink unit configured to couple a source line coupled to a main memory cell of the selected memory area to a ground terminal in is response to the read enable signal; a sensing unit coupled to a bit line coupled to the reference cell of the adjacent memory area and a bit line coupled to the main memory cell of the selected memory area and configured to sense data of the main memory cell of the selected memory area and output the sensed data to a pre-output terminal; and a comparison unit configured to compare a reference voltage with a voltage of the pre-output terminal and, output read data.

In another embodiment of the present invention, a layout structure of a resistive memory apparatus includes: a plurality of memory area; and a bit line driver/sinker disposed between adjacent memory areas. Each of the memory areas includes: a plurality of bit lines/source lines; a plurality of word lines arranged perpendicular to the bit lines/source lines; a plurality of reference word lines arranged perpendicular to the bit lines/source lines; a main memory cell array coupled between the plurality of bit lines/source lines and the plurality of word lines; and a reference cell array coupled between the plurality of bit lines/source lines and the plurality of reference word lines.

BRIEF DESCRIPTION OF THE DRAWINGS

Features, aspects, and embodiments are described in conjunction with the attached drawings, in which.

DETAILED DESCRIPTION

Hereinafter, a resistive memory apparatus, a layout structure, and a sensing circuit thereof according to the present invention will be described below with reference to the accompanying drawings through exemplary embodiments.

Figure 3:
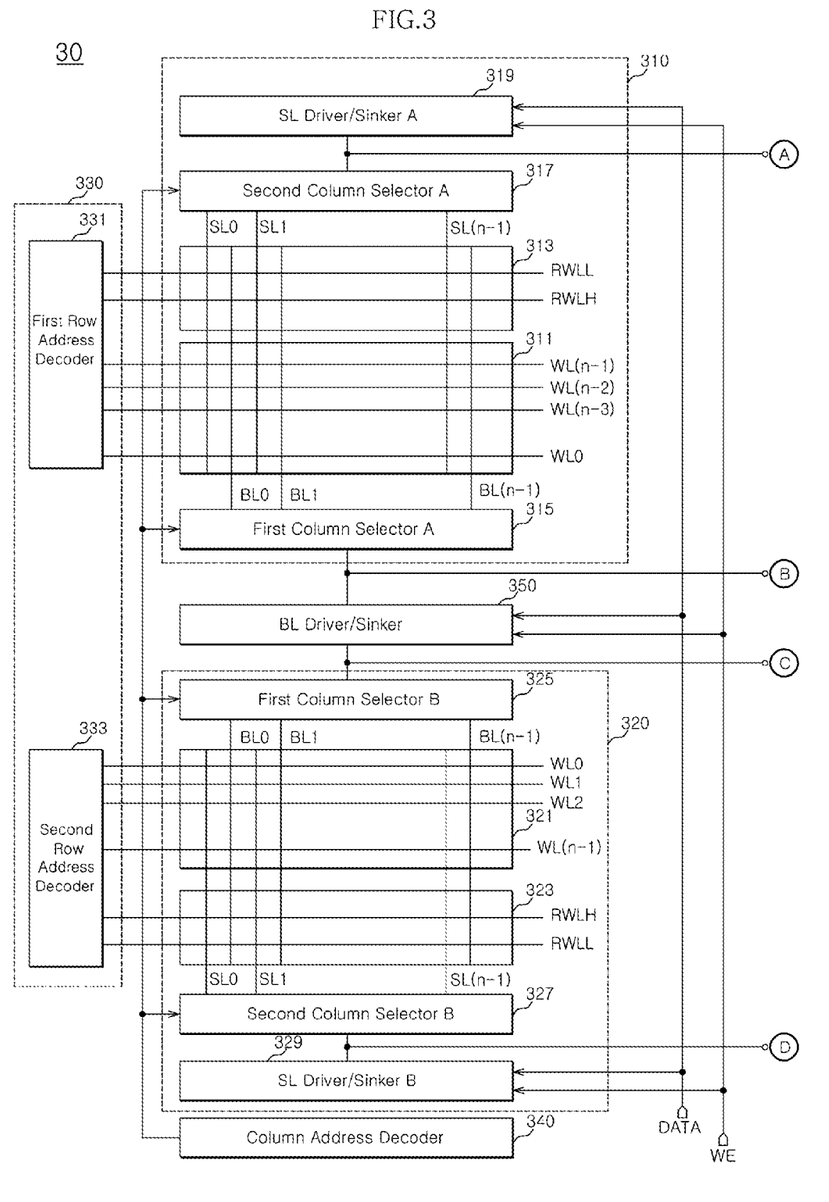
FIG. 3 is a configuration diagram of a resistive memory apparatus according to an embodiment of the present invention.

FIG. 3 is a configuration diagram of a resistive memory apparatus according to an embodiment of the present invention.

Referring to FIG. 3, the resistive memory apparatus 30 according to an embodiment of the present invention includes a first memory area 310, a second memory area 320, a row address decoder 330, a column address decoder 340, a bit line driver/sinker 350. The first memory area 310 includes a memory cell array 311 coupled between a plurality of first source lines/bit lines and a plurality of first word lines and a reference cell array 313 coupled between the plurality of first source lines/bit lines and a plurality of reference word lines. The second memory area 320 includes a memory cell array 321 coupled between a plurality of second source lines/bit lines and a plurality of second word lines and a reference cell array 323 coupled between the plurality of second source lines/bit lines and a plurality of reference word lines. The row address decoder 330 is configured to drive a word line or reference word line in response to an external address. The column address decoder 340 is configured to drive a bit line and a source line in response to an external address. The bit line driver/sinker 350 is commonly coupled to the first and second memory areas 310 and 320 and configured to apply a predetermined voltage to the bit line driven by the column address decoder 340.

The first and second memory areas 310 and 320 may have a similar structure, for example, a symmetrical structure with respect to the bit line driver/sinker 350.

More specifically, the first memory area 310 includes a main memory cell array 311, a reference cell array 313, a first column selector 315, a second column selector 317, and a source line driver/sinker 319. The main memory cell array 311 includes a plurality of memory cells coupled between the plurality of bit lines/source lines BL/SL and the plurality of word lines. The reference cell array 313 is coupled between the plurality of bit lines/source lines BL/SL and the plurality of reference word lines RWLH and RWLL. The first column selector 315 is configured to drive a bit line in response to an output signal of the column address decoder 340. The second column selector 317 is configured to drive a source line in response to the output signal of the column address decoder 340. The source line driver/sinker 319 is configured to apply a predetermined voltage to the source line driven by the second column selector 317. Furthermore, the second memory area 320 includes a main memory cell array 321, a reference cell array 323, a first column selector 325, a second column selector 327, and a source line driver/sinker 329. The main memory cell array 321 includes a plurality of memory cells coupled between the plurality of bit lines/source lines BL/SL and the plurality of word lines. The reference cell array 323 is coupled between the plurality of bit lines/source lines BL/SL and the plurality of reference word lines RWLH and RWLL. The first column selector 325 is configured to drive a bit line in response to an output signal of the column address decoder 340. The second column selector 327 is configured to drive a source line in response to the output signal of the column address decoder 340. The source line driver/sinker 329 is configured to apply a predetermined voltage to the source line driven by the second column selector 327.

Furthermore, the row address decoder 330 may include a first row address decoder 331 and a second row address decoder 333. The first row address decoder 331 is configured to drive a word line of the first memory area 310, and the second row address decoder 333 is configured to drive a word line of the second memory area 320.

In the resistive memory apparatus 30 the reference cell arrays 313 and 323 are formed in a row direction. That is, each of the reference cell arrays 313 and 323 includes a plurality of reference cells coupled to the pair of reference word lines RWLH and RWLL, high data are stored in reference cells coupled to the reference word line RWLH, and low data are stored in reference cells coupled to the reference word line RWLL. Before a read operation is started, preset data may be written into the respective cells of the reference cell arrays 313 and 323.

Furthermore, the pair of memory areas 310 and 320 are arranged in such a manner as to share the bit line driver/sinker 350, which makes it possible to increase area efficiency.

Referring to FIG. 3, a write operation for the reference cells will be described.

As a write command is applied, a write enable signal WE is enabled to a high level, and a read enable signal RE is disabled to a low level. A reference word line is activated by the row address decoders 331 and 333, and a bit line and a source line of a reference cell, among a plurality of cells activated by the column address decoder 340 and the first and second column selectors 315, 317, 325, and 327, are driven by the bit line driver/sinker 350 and the source line driver/sinker 319 and 329, respectively, such that a critical current flows in the reference cell.

That is, the write operation for the reference cell is performed in the same manner as a write operation for a main memory cell. In other words, as the row address decoders 331 and 333 activate a reference word line instead of a main word line, reference data may be written in the same manner as the write operation for the main memory cell.

Therefore, components such as a reference driver and a reference column selector, which are required for the writing operation for the reference cell, may be omitted, and a separate operation for the write operation for the reference cell does not need to be defined. Therefore, the configuration of the resistive memory apparatus 30 may be simplified.

Subsequently, a read operation for the resistive memory apparatus 30 illustrated in FIG. 3 will be described.

Figure 4:
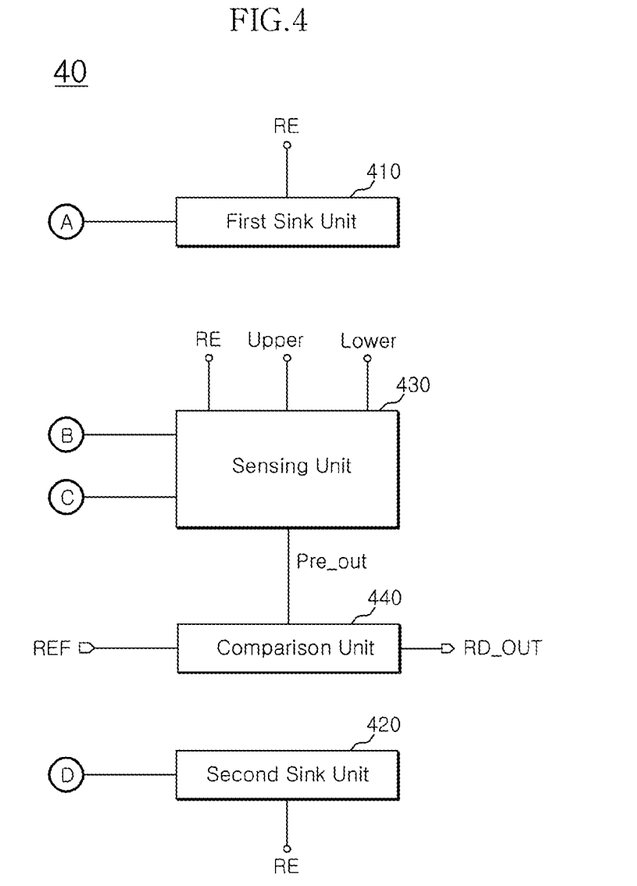
FIG. 4 is a configuration diagram of a sensing circuit for the resistive memory apparatus according to an embodiment of the present invention.
Figure 5:
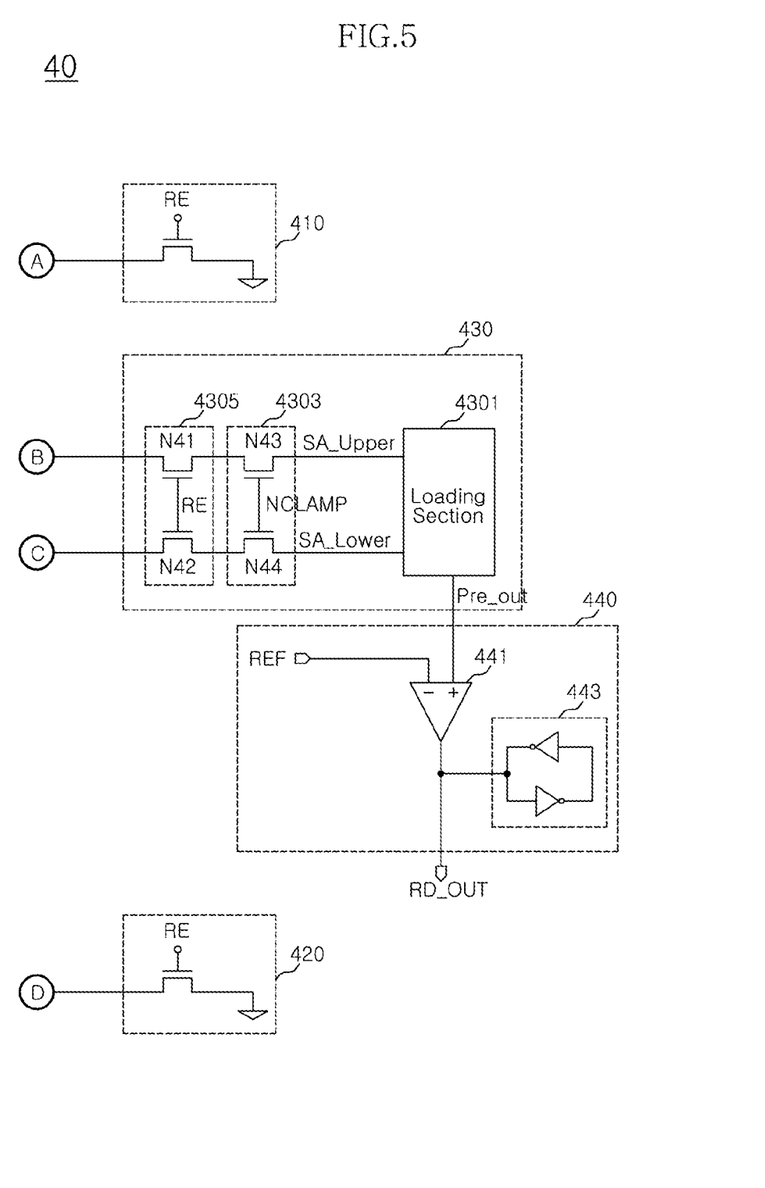
FIG. 5 is a configuration diagram of the sensing circuit of FIG. 4.

FIG. 4 is a configuration diagram of a sensing circuit for the resistive memory apparatus according to an embodiment of the ret present invention. FIG. 5 is a configuration diagram of the sensing circuit of FIG. 4.

Referring to FIG. 4, the sensing circuit 40 includes a first sink unit 410, a second sink unit 420, a sensing unit 430, and a comparison unit 440. The first sink unit 410 is configured to couple a source line selected by the second column selector 317 to a ground terminal. The second sink unit 420 is configured to couple a source line selected by the second column selector 327 to a ground terminal. The sensing unit 430 is configured to output a sensing voltage according to a voltage of a bit line selected by the first column selector 315 and a voltage of a bit line selected by the second column selector 325. The comparison unit 440 is configured to compare an output voltage of the sensing unit 430 with a reference voltage VREF and output read data RD_OUT.

Referring to FIG. 5, the first and second sink units 410 and 420 may include switching elements configured to be driven by the read enable signal RE and couple the source lines selected by the second column selectors 317 and 327 to the ground terminals, respectively.

Furthermore, the sensing unit 430 includes a loading section 4301, a clamping section 4303, and a switching section 4305. The loading section 4301 is configured to apply a current to the selected bit line of the first memory area 310 and the selected bit line of the second memory area 320. The clamping section 4303 is configured to prevent an excessive current from being applied to the selected bit lines of the first and second memory areas 310 and 320. The switching section 4305 is configured to provide the output current of the loading section 4301 to the selected bit lines of the first and second memory areas 310 and 320 during a read operation.

The comparison unit 440 includes a comparison circuit 441 and a latch 443. The comparison circuit 441 is configured to compare a voltage applied to a pre-output terminal Pre_out of the loading section 4301 with the reference voltage REF and output the read data RD_OUT. The latch 443 is configured to temporarily store the read data RD_OUT.

Referring to FIGS. 3 to 5, the read operation of the resistive memory apparatus according to an embodiment of the present invention will be described in more detail.

During the read operation, for example, when the write enable signal WE is enabled to a low level and the read enabled signal RE is disabled to a high level, the reference word lines RWLH and RWLL of an unselected memory area between the pair of memory areas 310 and 320 sharing the bit line driver/sinker 350 are activated to provide a reference current for determining data stored in a main memory cell.

For example, when a read operation for the main memory cell array 321 of the second memory area 320 is required, the reference word lines RWLH and RWLL of the first memory area 310 are activated to a logic high level to provide the reference current Then, columns of the first and second memory areas 310 and 320 are respectively selected by the column address decoder 340 and the first and second column selectors 315, 317, 325, and 327, and source lines of the selected columns are coupled to ground terminals through the first and second sink units 410 and 420, respectively.

Furthermore, bit lines of the selected columns are coupled to a first sensing terminal SA_Upper and a second sensing terminal SA_Lower of the sensing unit 430. Voltages of the selected bit lines are clamped to a constant value by the clamp voltage VCLAMP applied to the clamping section 4303.

A current path through the pair of reference cells is formed between the selected bit line of the first memory area 310 and the ground terminal, and a current IH+IL flows through the current path. Furthermore, a current path through the main memory cell is formed between the selected bit line of the second memory area 320 and the ground terminal, and a current IH or IL flows through the current path, depending on the data stored in the main memory cell.

Currents flowing into the selected bit lines of the first and second memory areas 310 and 320 are applied from the loading section 4301 through the switching elements N41 and 142 of the switching section 4305.

Figure 6:
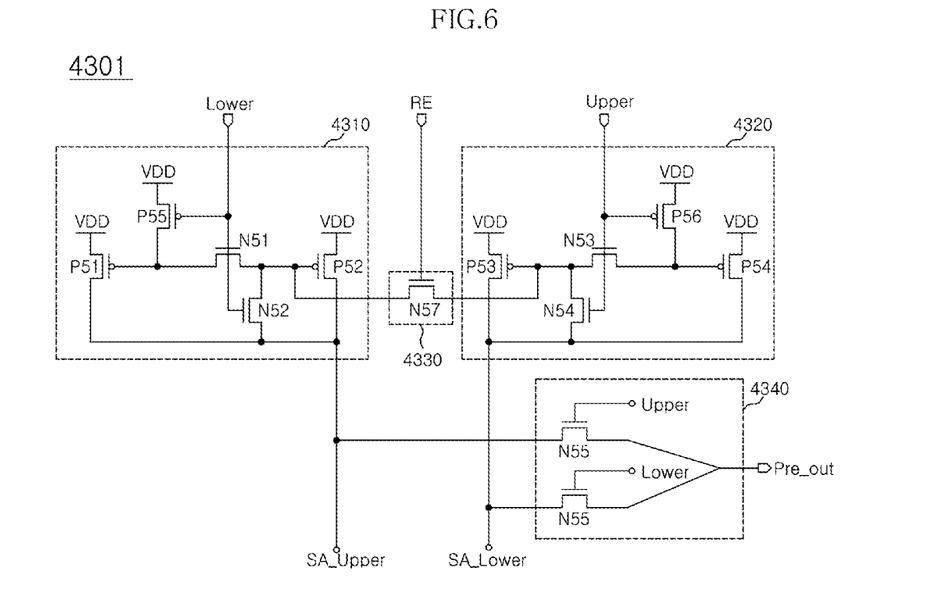
FIG. 6 is a configuration diagram of a loading section illustrated in FIG. 5.

FIG. 6 is a configuration diagram of the loading section illustrated in FIG. 5.

Referring to FIG. 6, the loading section 4301 includes a first current generator 4310, a second current generator 4320, a switch 4330, and an output section 4340. The first current generator 4310 is coupled between a power supply voltage terminal and the selected bit line of the first memory area 310 and configured to supply a current to flow into the selected bit line of the first memory area 310, in response to a second select signal Lower. The second current generator 4320 is coupled between a power supply voltage terminal and the selected bit line of the second memory area 320 and configured to supply a current to flow into the selected bit line of the second memory area 320, in response to a first select signal Upper. The switch 4330 is configured to be driven according to the read enable signal RE and coupled between the first and second current generators 4310 and 4320. The output section 4340 is configured to provide an output voltage of the first current, generator 4310 or an output voltage of the second current generator 4320 to the pre-output terminal Pre_out.

Referring to FIG. 6, an operation in case where the current flowing through the first sensing terminal SA_Upper is IH+IL and the current flowing through the second sensing terminal SA_Lower is IH or IL will be described.

Since a main memory cell to be read is located in the second memory area 320, it is assumed that the logic values of control signals generated from a control circuit inside a chip (not illustrated), that is, the first and second select signals Upper and Lower are inputted at a logic low level and a logic high level, respectively. Furthermore, in the read mode, the read enable signal RE may be enabled to a logic high level.

In such a state, on/off states of the respective switching components illustrated in FIG. 6 are set as follows. As a switching component P55 is turned off and switching components N51 and N52 are turned on, the gates of the switching components P51 and 52 are coupled to each other, and the drains thereof are also coupled to each other. Since a switching component P56 is turned on to apply a power supply voltage to the gate of a switching component P54, the switching component P54 is turned off. Furthermore, as switching components N53 and N54 are turned off and a switching component N57 is turned on, the gate of the switching component P53 is coupled to the gates of the switching components P52 and P51. When it is assumed that the sizes of the switching components P51, P52, P53, and P54 are equal to each other, the switching components P51 and P52 and the switching component P53 function as a 2:1 current copier. That is, since it is assumed that all of the switching components are used in a current saturation region, the sources of the switching components are equalized to the power supply voltage, and the gates of the switching components are coupled to a terminal, the current ratio is equalized to the size ratio of the switching components.

Furthermore, as a switching component N55 is turned off and a switching component N56 is turned on, the second sensing terminal SA_Lower is coupled to the pre-output terminal Pre_out. That is, the bit line of the second memory area 320, which is selected for the read operation is coupled to the pre-output terminal Pre_out is such that the cell current of the bit line is compared with the current of the second current generator 4320. As a result, the output voltage is determined.

Figure 7:
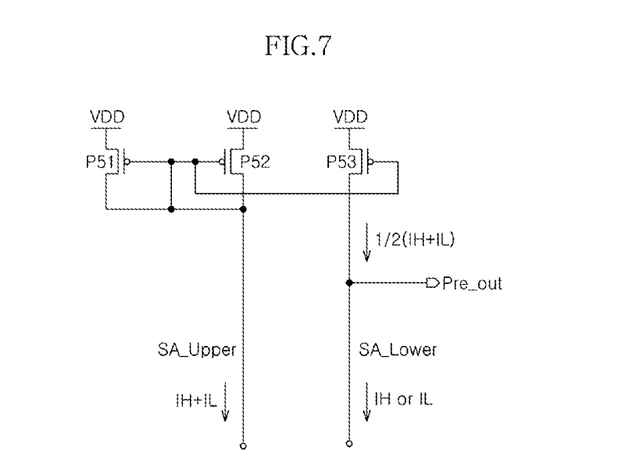
FIG. 7 is a simplified circuit diagram of the loading section of FIG. 6.

FIG. 7 is a simplified circuit diagram of the loading section of FIG. 6 by omitting the turned-off switching components and the resistances of the turned-on switching components, so as to represent the turned-on switching components by a shorted line.

Referring to FIG. 7, the current flowing into the first sensing terminal SA_Upper is applied by the switching components P51 and P52, and the gate voltages of the switching components P51 and P52 are transmitted to the switching component P53 such that current copying is performed at 2:1 corresponding to the size ratio of the switching components P51 and P52 to the switching component P53 through the switching component P53. That is, a current of (½)*(IH+IL) corresponding to the half of the current IH+IL flowing in the switching components P51 and P52 is applied to the pre-output terminal Pre_out through the switching component P53. In addition, the current IH or IL flows toward the second sensing terminal SA_Lower, depending on cell data to read.

When the current IH flows toward the second sensing terminal SA_Lower because the cell has high resistance, the current of (½)*(IH+IL) applied by the switching component 53 becomes larger than the current IH such that the voltage of the pre-output terminal Pre_out gradually rises. In this case, the output RD_OUT of the comparison unit 440 which compares the voltage of the pre-output terminal Pre_out with the reference voltage REF becomes a logic high level. Then, the high data is read to the outside.

On the other hand, when the current IL flows toward the second sensing terminal SA_Lower because the cell has low resistance, the current of (½)*(IH+IL) provided by the switching component 53 becomes smaller than the current IL such that the voltage of the pre-output terminal Pre_out gradually drops. In this case, the output RD_OUT of the comparison unit 440 which compares the voltage of the pre-output terminal Pre_out with the reference voltage REF becomes a logic low level. Then, the low data is read to the outside.

According to the above-described embodiment, the pair of reference word lines are used to implement the reference cells. Furthermore, the reference cells share the source lines and the bit lines of the main memory cells. Therefore since a write circuit or read circuit for the reference cells does not need to be provided separately, the configuration of the resistive memory apparatus may be simplified, and a write operation or read operation for the to reference cells does not need to be defined.

In FIG. 3, it has been described that the reference word lines are arranged at the lowermost side of the main memory cells, but the present invention is not limited thereto. That is, the reference word lines may be arranged at the uppermost side of the main memory cells or in the middle of the main memory cells.

Furthermore, FIG. 6 illustrates that the switch 4330 of the loading section 4301 includes an NMOS transistor. However, the switch 4330 may include any other type of transmission gate so as to improve a switching characteristic.

While certain embodiments have been described above, it will be understood to those skilled in the art that the embodiments described are by way of example only. Accordingly, the apparatus and method described herein should not be limited based on the described embodiments. Rather, the apparatus and method described herein should only be limited in light of the claims that follow when taken in conjunction with the above description and accompanying drawings.

What is claimed is:

1. A resistive memory apparatus comprising a plurality of memory areas each comprising a main memory cell array coupled to a plurality of word lines and a reference cell array coupled to a plurality of reference word lines,
wherein the plurality of reference word lines comprise:
a first reference word line coupled to reference memory cells configured to store high-level data; and
a second reference word line coupled to reference memory cells configured to store low-level data.

2. The resistive memory apparatus according to claim 1, wherein the main memory cell array shares bit lines and source lines with the reference cell array.

3. The resistive memory apparatus according to claim 1, wherein
each of the memory areas shares a bit line driver/sinker with an adjacent memory area.

4. A resistive memory apparatus comprising:
a first memory area comprising a first main memory cell array coupled between a plurality of first source lines/bit lines and a plurality of first word lines and a first reference cell array coupled between the plurality of first source lines/bit lines and a plurality of first reference word lines;
a second memory area comprising a second main memory cell array coupled between a plurality of second source lines/bit lines and a plurality of second word lines and a second reference cell array coupled between the plurality of second source lines/bit lines and a plurality of second reference word lines;
a row address decoder configured to drive a word line or reference word line in response to an external address; and
a column address decoder configured to drive a bit line and a source line in response to an external address;
wherein the plurality of first reference word lines and the plurality of second reference word lines, respectively, comprise:
a first reference word lines coupled to reference memory cells configured to store high-level data; and
a second reference word lines coupled to reference memory cells configured to store low-level data.

5. The resistive memory apparatus according to claim 4, wherein the first memory area comprises:
a first column selector configured to drive a first bit line in response to an output signal of the column address decoder;
a second column selector configured to drive a first source line in response to an output signal of the column address decoder; and
a source line driver/sinker configured to apply a predetermined voltage to the source line driven by the second column selector.

6. The resistive memory apparatus according to claim 4, wherein the second memory area comprises:
a first column selector configured to drive a second bit line in response to an output signal of the column address decoder;
a second column selector configured to drive a second source line in response to an output signal of the column address decoder; and
a source line driver/sinker configured to apply a predetermined voltage to the source line driven by the second column selector.

7. The resistive memory apparatus according to claim 4, wherein the plurality of first reference word lines and the plurality of second reference word lines, respectively, comprise a pair of reference word lines.

8. The resistive memory apparatus according to claim 4, further comprising a bit line driver/sinker commonly coupled to the first and second memory areas and configured to apply a predetermined voltage to the bit line driven by the column address decoder.

9. A sensing circuit for a resistive memory apparatus which includes a plurality of memory areas each including a main memory cell array and a reference cell array coupled to a plurality of reference word lines and a bit line driver/sinker shared by adjacent memory areas, the sensing circuit comprising:
a first sink unit configured to couple a source line coupled to a reference cell of an adjacent memory area sharing the bit line driver/sinker with a selected word line to a ground terminal, in response to a read enable signal;
a second sink unit configured to couple a source line coupled to a main memory cell of the selected memory area to a ground terminal in response to the read enable signal;
a sensing unit coupled to a bit line coupled to the reference cell of the adjacent memory area and a bit line coupled to the main memory cell of the selected memory area and configured to sense data of the main memory cell of the selected memory area and output the sensed data to a pre-output terminal; and
a comparison unit configured to compare a reference voltage with a voltage of the pre-output terminal and output read data.

10. The sensing circuit according to claim 9, wherein the sensing unit comprises:
a loading section configured to supply a current to the bit line coupled to the reference cell of the adjacent memory area and the bit line coupled to the main memory cell of the selected memory area; and
a switching section configured to provide the output current of the loading section to the bit line of the selected memory area and the bit line of the adjacent memory area, in response to the read enable signal.

11. The sensing circuit according to claim 10, wherein the loading section comprises:
a first current generator coupled between a power supply voltage terminal and the bit line of the adjacent memory area and configured to be driven according to a second select signal and output a current to flow into the bit line of the adjacent memory area;
a second current generator coupled between a power supply voltage terminal and the bit line of the selected memory area and configured to be driven according to a first select signal and output a current to flow into the bit line of the selected memory area;
a switch configured to be driven according to the read enable signal and coupled between the first and second current generators; and
an output section configured to provide an output voltage of the first current generator or an output voltage of the second current generator to the pre-output terminal.

* * * * *